United States Patent
Yang

(10) Patent No.: US 6,570,519 B1
(45) Date of Patent: May 27, 2003

(54) SWITCHED-CAPACITOR SUMMER CIRCUITS AND METHODS AND SYSTEMS USING THE SAME

(75) Inventor: Yu Qing Yang, Austin, TX (US)

(73) Assignee: Cirus Logic, Inc., Austin, TX (US)

( * ) Notice: Subject to any disclaimer, the term of this patent is extended or adjusted under 35 U.S.C. 154(b) by 0 days.

(21) Appl. No.: 09/904,940

(22) Filed: Jul. 12, 2001

(51) Int. Cl.[7] .............................................. H03M 3/00
(52) U.S. Cl. ...................................... 341/143; 341/144
(58) Field of Search ............................... 341/143, 144, 341/145, 156

(56) References Cited

U.S. PATENT DOCUMENTS 5,283,578 A * 2/1994 Ribner et al. ............... 341/143
6,014,097 A * 1/2000 Brandt ........................ 341/156
6,362,763 B1 * 3/2002 Wang ......................... 341/143

* cited by examiner

Primary Examiner—Peguy Jeanpierre
Assistant Examiner—Joseph Lauture
(74) Attorney, Agent, or Firm—James J. Murphy, Esq.; Winstead Schrest & Minick, P.C.

(57) ABSTRACT

A switched- capacitor summer 400 includes an operational amplifier 206 having an input and an output, first and second parallel capacitors 307, 401, first switching circuitry 308, 404 and second switching circuitry 402, 403. First switching circuitry 308, 404 discharges first capacitor 307 during a first timing phase and couples second capacitor 401 between the input and the output of operational amplifier 306 during a first timing phase. Second switching circuitry 402, 403 couples a first capacitor 307 between the input and output of operational amplifier 306 during the second phase to transfer charge from capacitor $C_S$ to capacitor 307 and charge up capacitor $C_H$ during the second phase.

20 Claims, 5 Drawing Sheets

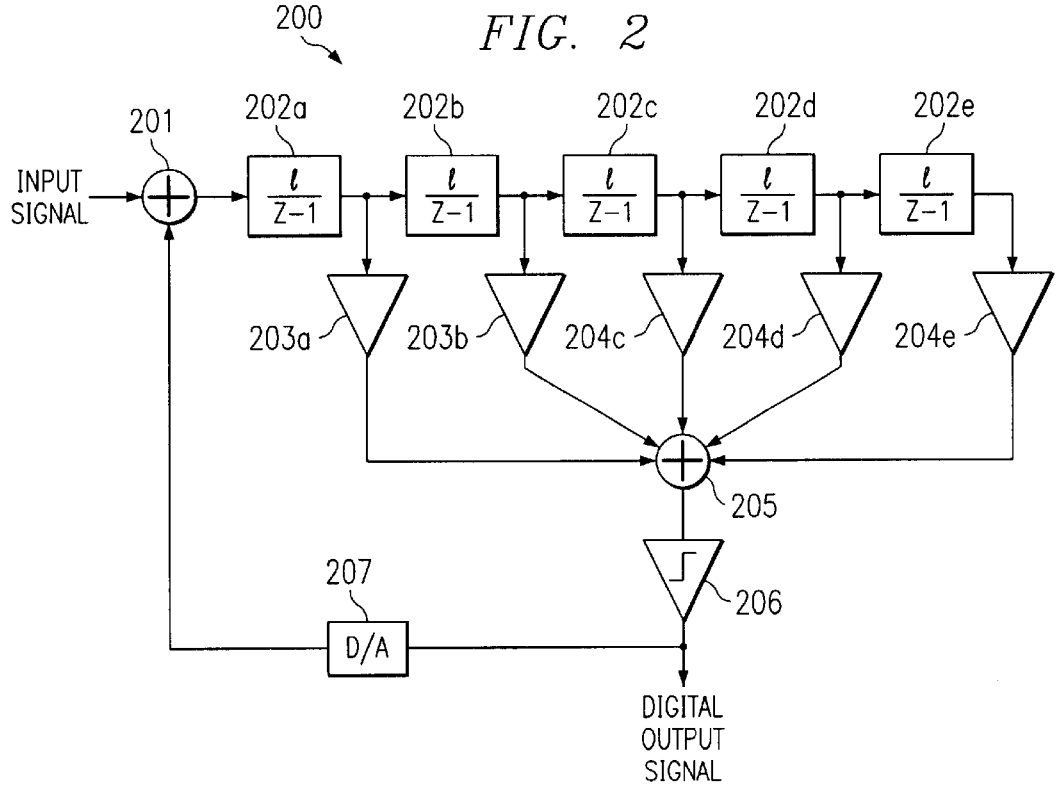
FIG. 2
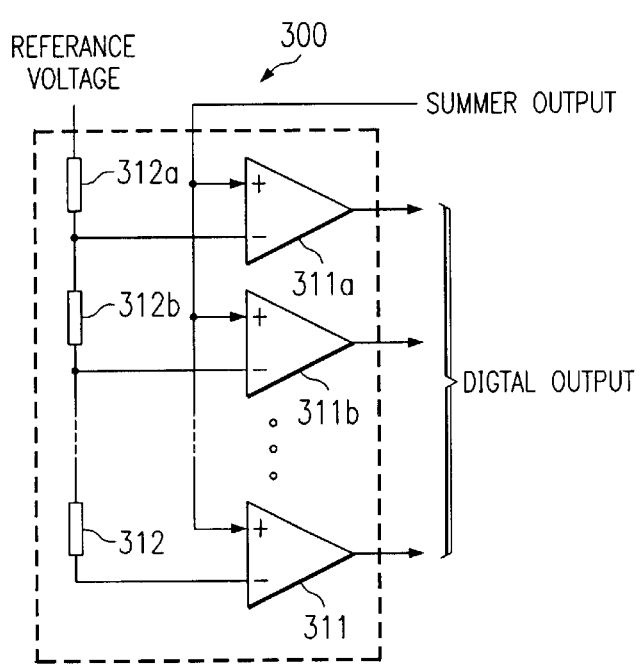
FIG. 3B
FIG. 3C
FIG. 3D

SWITCHED-CAPACITOR SUMMER CIRCUITS AND METHODS AND SYSTEMS USING THE SAME

CROSS REFERENCE TO RELATED APPLICATIONS

This application for patent is related to the following applications for patent:

Pending U.S. patent application Ser. No. 09/904,649, filed Jul. 12, 2001 by inventor Yu Qing YANG, entitled "SWITCHED-CAPACITOR CIRCUITS AND METHODS WITH IMPROVED SETTLING TIME AND SYSTEMS USING THE SAME"; and Pending U.S. patent application Preliminary Ser. No. 09/870,900, filed May 30, 2001 by inventor Yu Qing YANG and entitled "SWITCHED-CAPACITOR SUMMER CIRCUITS AND METHODS AND SYSTEMS USING THE SAME".

BACKGROUND OF THE INVENTION

1. Field of the Invention

The present invention relates in general to switched-capacitor techniques and in particular to switched-capacitor summer circuits and methods and systems using the same.

2. Description of the Related Art

Delta-sigma modulators are particularly useful in digital to analog and analog to digital converters (DACs and ADCs). Using oversampling, the delta-sigma modulator spreads the quantization noise power across the oversampling frequency band, which typically much greater than the input signal bandwidth. Additionally, the delta sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a linear filter, quantizer and a feedback loop with a digital to analog converter coupling the quantizer output and the inverting input of the summer. In a first order modulator, the linear filter comprises a single integrator stage while the filter in higher a order modulator comprises a cascade of a corresponding number of integrator stages. The quantizer can be either a one-bit or a multiple-bit quantizer.

In the case of a higher-order multiple-bit modulator with weighted feed-forward summation, the outputs of the integrator stages are passed to a summation circuit. This summation circuitry does not have a "memory." In other words, this circuitry must be reset to zero after each summation operation, even though the integrator outputs typical only increment up or down in voltage by a small amount with each new sample. Consequently, the summation circuitry must handle relatively large voltage swings, especially when the integrator outputs approach their maximum values. Moreover, when the summation circuitry includes an operational amplifier, a large tail current is required to achieve a sufficiently large output slew rate.

SUMMARY OF THE INVENTION

The principles of the present invention and embodied in switched-capacitor summation techniques. According to one such embodiment, a switched-capacitor summer is disclosed which includes an operational amplifier having an input and an output, first and second parallel capacitors, and first switching circuitry. The first switching circuit discharges the first capacitor during a first timing phase and couples the first capacitor between the input and the output of operational amplifier during a second timing phase. The second switching circuit couples the second capacitor between the input and output of operational amplifier during the first phase to maintain a voltage at the operational amplifier output and charges the second capacitor during the second phase.

The principles of the present invention allow for the construction and operation of summation circuits which are faster and consume less power. In particular, according to the inventive concepts, hold up capacitors and associated switching circuitry are provided such that the summer output voltage can be maintained while the conventional feedback capacitors are reset after each summation operation.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a functional block diagram of an exemplary $5^{th}$ order delta-sigma modulator suitable for use in circuits and systems such as the analog to digital converter shown in FIG. 1A;

FIG. 3B is an electrical schematic diagram of a flash A/D converter suitable for use as the multi-bit quantizer of FIG. 3A;

FIGS. 3C and 3D are diagrams respectively illustrating the typical outputs from single-bit and multiple-bit quantizers;

DESCRIPTION OF THE PREFERRED EMBODIMENTS

The principles of the present invention and their advantages are best understood by referring to the illustrated embodiment depicted in FIGS. 1–4B of the drawings, in which like numbers designate like parts.

Figures 1A, 1B:
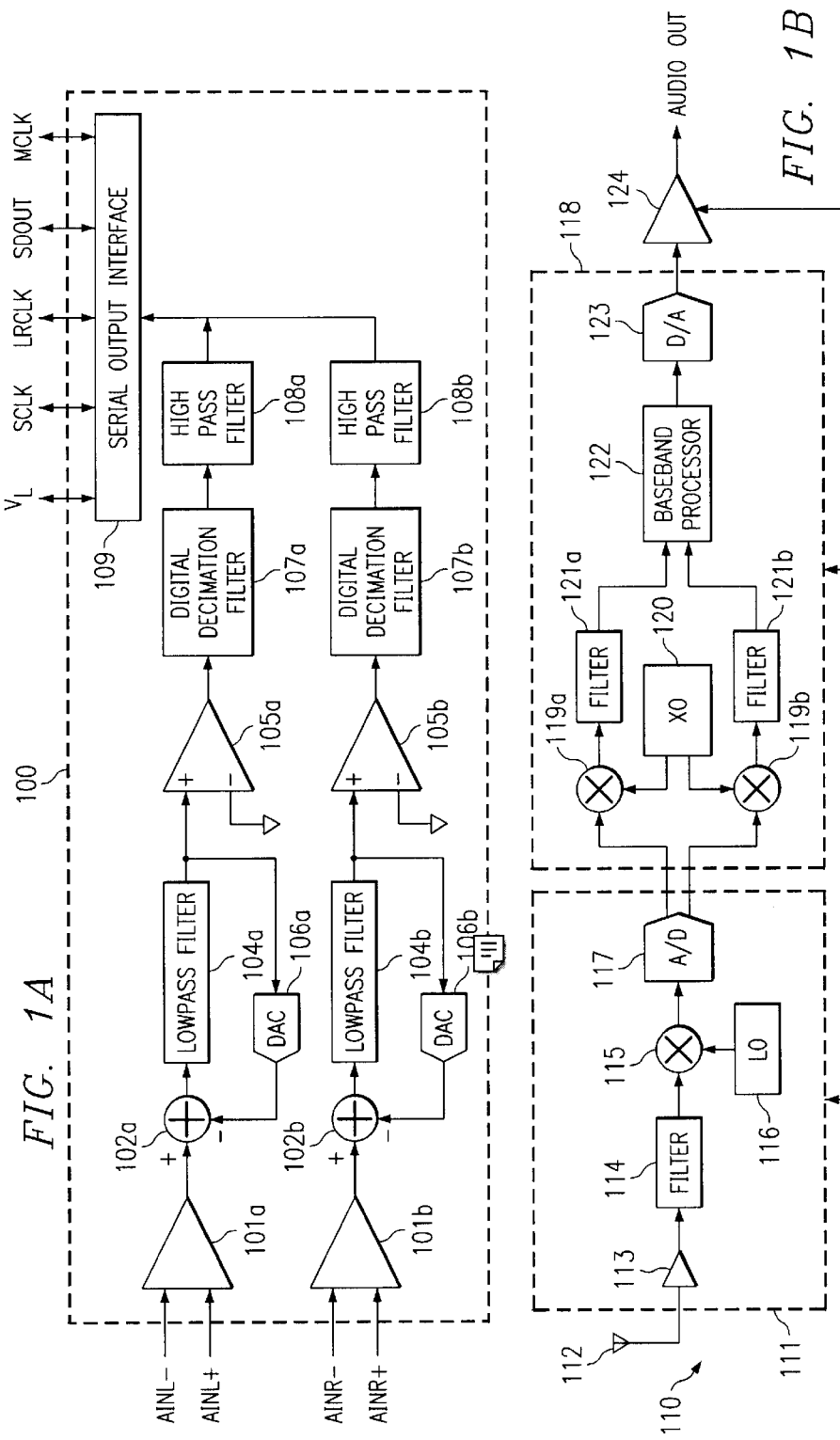
FIG. 1A is a high level functional block diagram of an analog to digital converter suitable for illustrating the application of the inventive principles.
FIG. 1B is a high level functional block diagram of a digital radio demonstrating a use of the analog to digital converter of FIG. 1A.

FIG. 1A is a high level functional block diagram of a single-chip audio analog-to-digital (A/D) 100 suitable for practicing the principles of the present invention. A/D converter 100 is only one of a number of possible applications requiring switched-capacitor integrator and summer stages. Other examples include digital to analog converters (DACs) and Codecs.

A/D converter 100 includes two conversion paths for converting left and right channel analog audio data respectively received at left and right analog differential inputs AINL+/− and AINR+/−. The analog inputs are each passed through an input gain stage 101 and then to a 5th order delta-sigma modulator.

Each delta-sigma modulator is represented in FIG. 1 by a summer 102, low-pass filter 104, comparator (quantizer) 105 and DAC 106 in the feedback loop. The outputs from the delta-sigma modulators are passed through a decimation filter 107 and a high pass filter 108.

The resulting left and right channel digital audio data are output through a single serial port SDOUT of serial output interface 109, timed with serial clock SCLK and left-right clock LRCLK in accordance with the Digital Interface Format (DIF). The SCLK and LRCLK clocks can be generated externally and input to converter 100 or can be generated on-chip, along with the associated data, in response to a received master clock MCLK.

One possible application of A/D converter is in a digital radio 110, such as that shown in FIG. 1B.

Digital radio 110 includes an analog section or front-end 111 which receives radio frequency (RF) signals from an associated antenna 112. Analog front-end 111 is preferably a conventional RF down-converter including a low noise amplifier (LNA) 113 for setting the system noise figure, a bandpass filter 114 and mixer 115 driven by an analog local oscillator 116. The mixed-down analog signal is then converted into digital form by analog to digital converter 117.

The digitized data output from A/D converter 117 is passed to digital processing section 118. A pair of mixers 119a,b generate in-phase (I) and quadrature (Q) signals from a corresponding pair of clock phases from crystal oscillator 120. The I and Q signals are next passed through bandpass filters 121a and 121b on to digital baseband processor 122. The processed digital signal is then re-converted to analog (audio) form by D/A converter 123.

A switched mode (Class D) audio power amplifier (APA) 124 is used to drive an external set of speakers or a headset. Preferably, at least some of the components of digital radio 110 are powered by a switched mode power supply (SMPS) 124

FIG. 2 is an exemplary 5th order delta-sigma modulator 200 comprising an input summer 201 and 5 integrator stages 202a,e. Delta sigma modulator 200 is of a weighted feed-forward design in which the outputs of each of the integrator stages are passed through a gain stage (amplifier) 202a,e to summer 205. The output from summer 205 is quantized by a multiple-bit quantizer 206 which provides the digital output signal. Additionally, the output from quantizer 206 is feedback to the inverting of summer 201 through digital to analog converter 207.

Figure 3A:
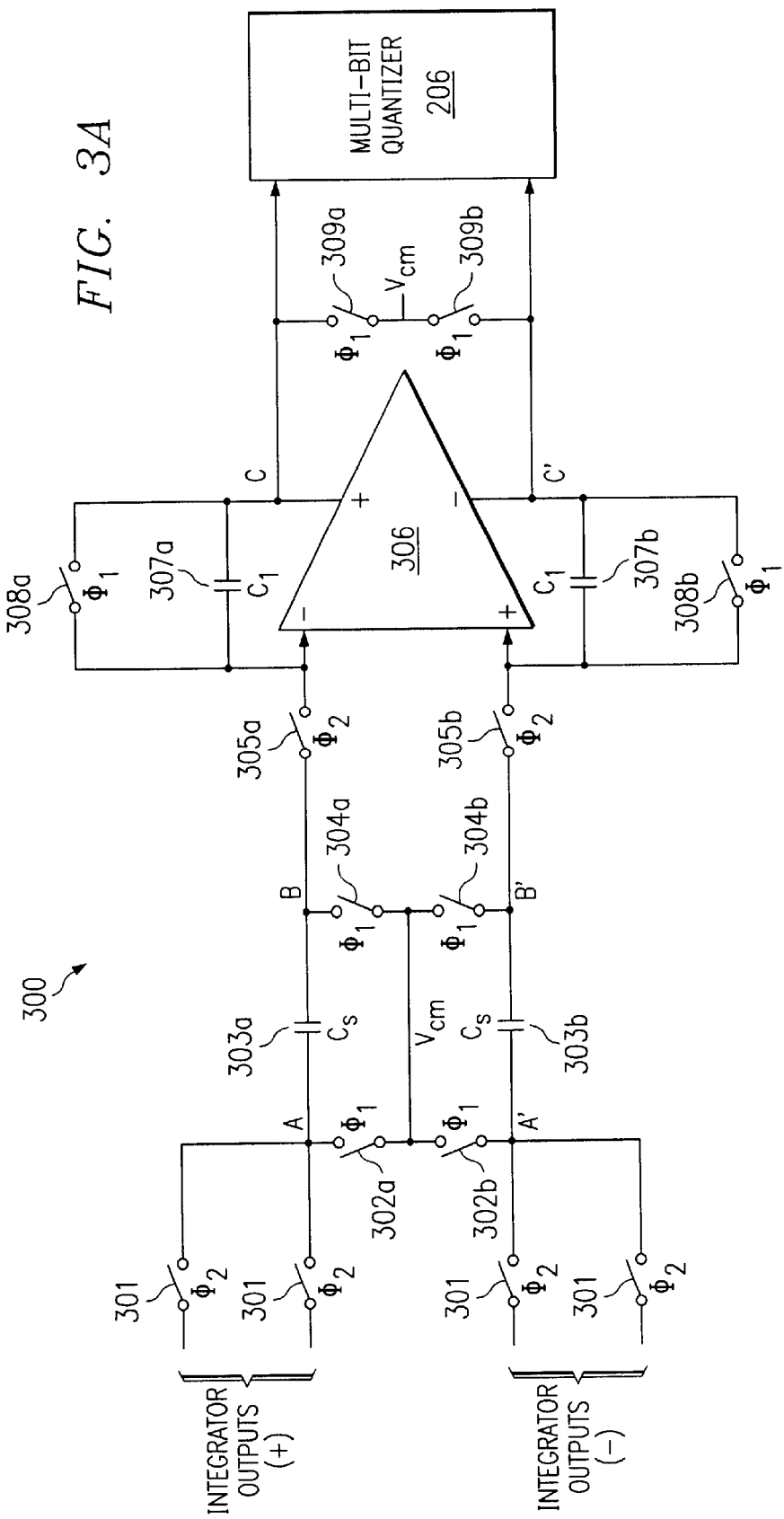
FIG. 3A is an electrical schematic diagram of a conventional switched-capacitor summer circuit.

FIG. 3A is an electrical schematic diagram of a conventional switched-capacitor fully-differential summing circuit 300. During Phase 1 (φ1), input nodes A and A', sampling nodes B and B', and output nodes C and C' are brought to the common mode voltage $V_{CM}$ by switches 302a,b, 304a,b and 309a,b, respectively. Additionally, integrator capacitors ($C_I$) 307a,b are discharged by switches 308a,b.

During Phase 2 (φ2), the differential integrator outputs are sampled by switches 301 onto sampling capacitors ($C_S$) 303a,b. Switches 305a,b transfer the charge to the summing nodes of operational amplifier 306 and integrator capacitors $C_I$. Operational amplifier 306 drives multi-bit quantizer 206.

Multiple-bit quantizer 206, could be for example, a Flash A/D converter such as shown in FIG. 3B. Flash A/D converter 310 is based on a series of parallel opamp comparators 311 comparing the differential summer output against a set of voltages generated by a ladder of resistors 312 from a reference voltage.

As shown in FIGS. 3C and 3D, the advantage of a multiple-bit quantizer is its ability to more closely represent the analog input voltage. Specifically, FIG. 3C shows the feedback voltage at the negative input to input summer 201 from DAC 207 when a single-bit quantizer is used. In this case, the feedback voltage for a given sample is represented by one of only two levels. On the other hand, for a multiple-bit quantizer, as illustrated in FIG. 3D, the feedback voltage is represented by a corresponding multiple of possible voltage levels and hence more closely approximates the signal voltage.

Multiple-bit quantizer 206 presents a significantly large capacitive load at the output of summer 205. The primary source of this capacitive loading is the capacitance of the input gate transistors of comparators 311. Since the nodes of summer 300 are discharged ("reset") during Phase 1, during Phase 2, summer 300 must drive this capacitive loading from zero voltages to the voltage level representing the current sample.

Figure 4A:
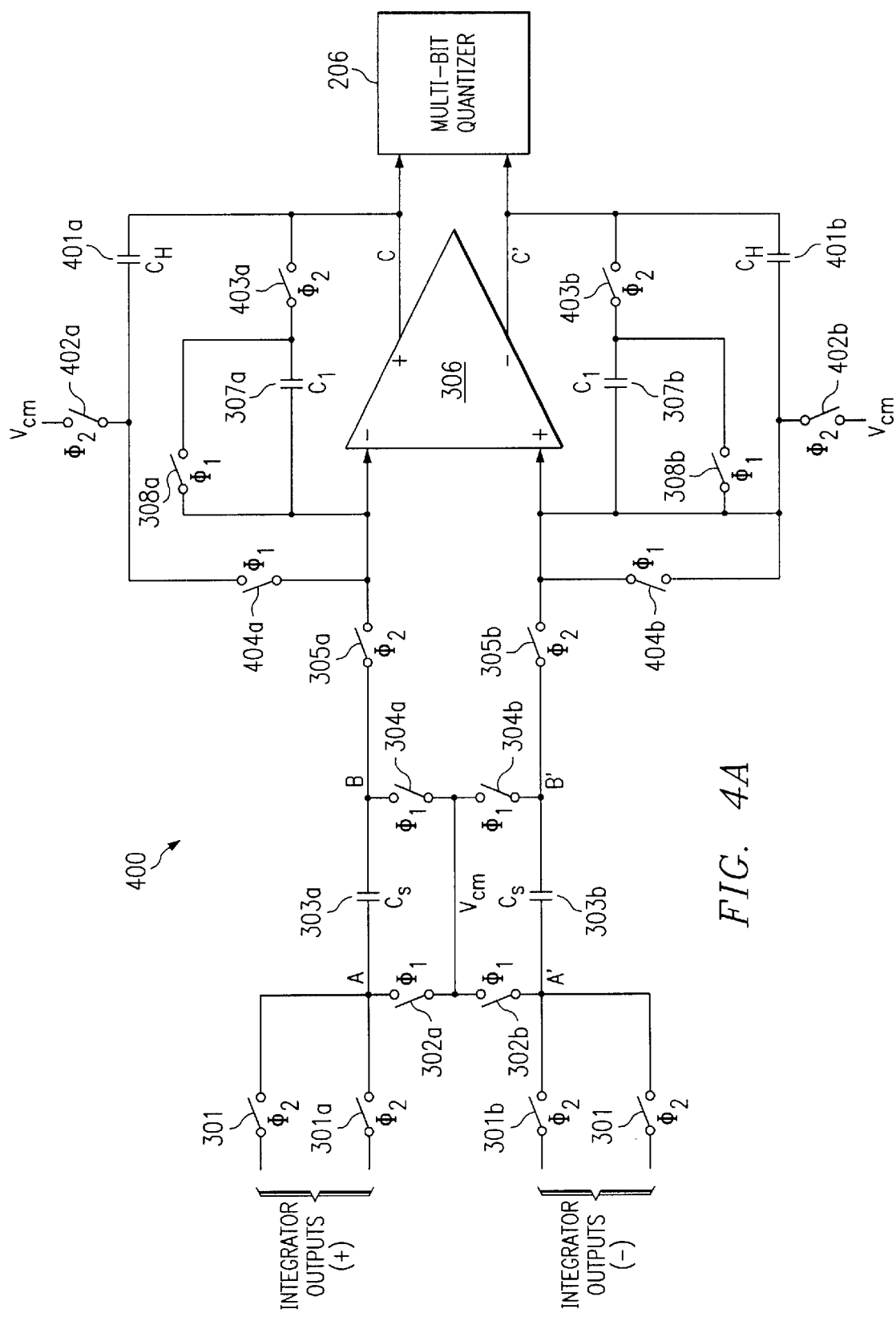
FIG. 4A is an electrical schematic diagram of a first switched-capacitor summer according to the inventive principles.

FIG. 4 is an electrical schematic of a switched-capacitor summer—gain stage 400 according to the present inventive teachings and suitable for use, in one application, as summer 205 in delta sigma modulator 200.

For each of the differential feedback paths summer—gain stage 200, a set of hold-up capacitors ($C_H$) 401a,b are provided in parallel with integration capacitors $C_I$. A switch 402a,b is associated with each capacitor $C_H$ for selectively coupling one plate to the common mode voltage $V_{CM}$ during Phase 2 while a switch 404a,b couples that plate with the corresponding opamp summing node during Phase 1. The opposing plates of capacitors $C_H$ are coupled to the corresponding outputs of opamp 306. The integration capacitors $C_I$ are selectively coupled with the corresponding outputs of opamp 306 by switches 403a,b during Phase 2.

Summer 400 operates as follows. During Phase 1, switches 302a,b and 304a,b close to discharge sampling capacitors $C_S$ as discussed above. Additionally, switches 308a,b and 404a,b close. In this configuration, integrator capacitors $C_I$ are discharged. At the same time, hold-up capacitors $C_H$ hold up the output nodes C and C' at the voltage charged thereon during the last Phase 2 cycle.

On the next Phase 2 cycle, switches 404a,b disconnect the left side plates of hold-up capacitors $C_H$ from the op am summing nodes while switches 402a,b connect those plates to the common mode voltage $V_{CM}$. The right side plates of hold up capacitors $C_H$ then charge to the output voltage. Hold-up capacitors $C_H$ have now been charged in preparation to hold-up the output nodes C and C' on the next Phase 1 cycle. At the same time, switches 305a,b and 403a,b close such that the charge on sampling capacitors $C_S$ is transferred onto integrator capacitors $C_I$.

Consequently, the hold-up capacitors $C_H$ are able to maintain the opamp output nodes C and C' at a non-zero voltage such that the voltage swing and driving current required of opamp 306 is substantially reduced. A substantial amount of power is saved and the circuit response is faster. Notwithstanding, since integrator capacitors $C_I$ are reset during each Phase 1, "memory" caused by the accumulation of charge on integrator capacitors $C_I$ is avoided.

Figure 4B:
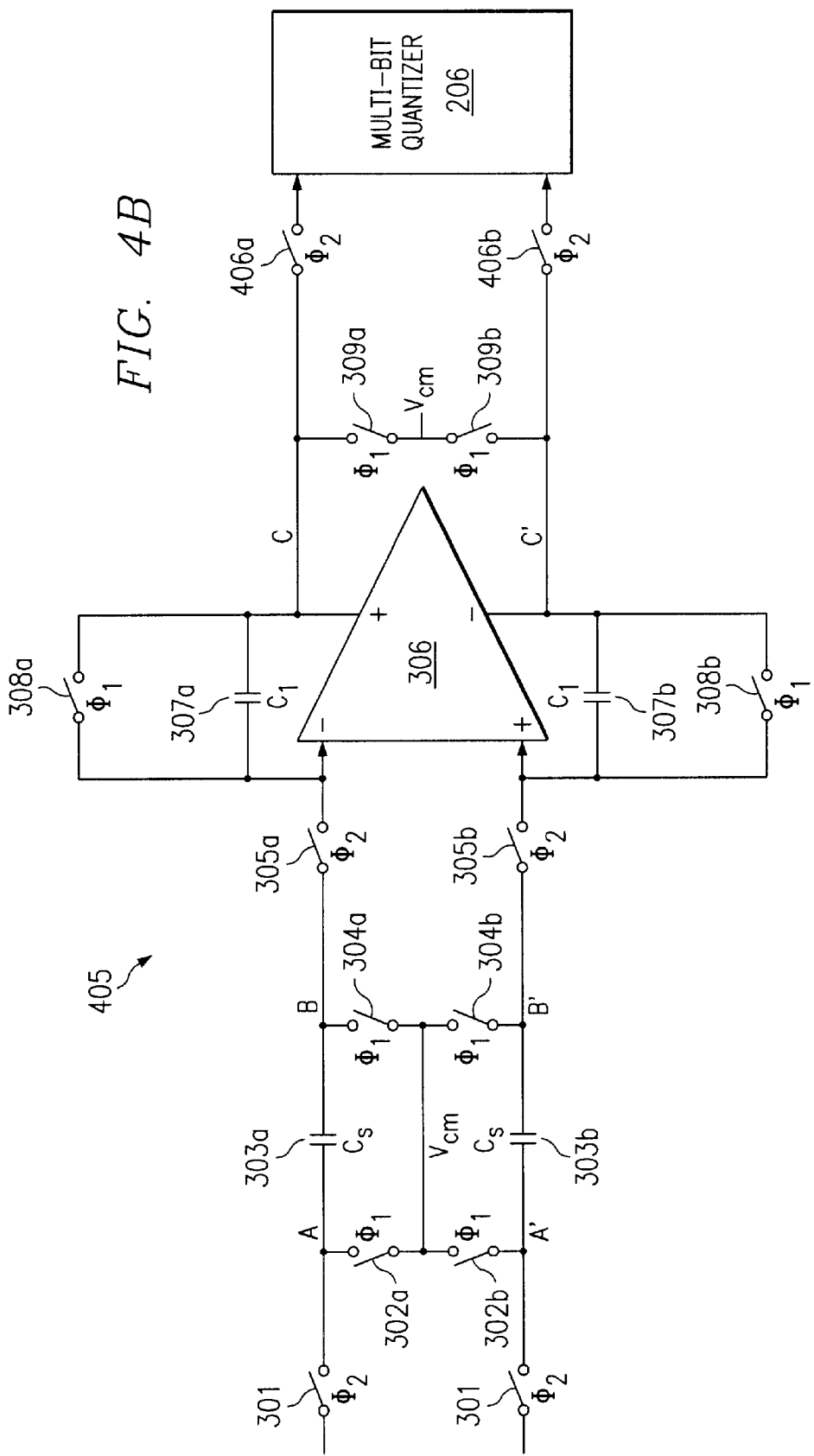
FIG. 4B is an electrical schematic diagram of a second switched-capacitor summer according to the inventive principles.

It should be noted that hold-up capacitors $C_I$ can be relatively small. A simplified summation circuit 400 according to the inventive concepts is depicted in FIG. 4B. In this embodiment, the parasitic capacitance at the inputs to quantizer 206 are allowed to hold the previous output voltage during Phase 1. During Phase 2, switches 406 close and the voltage at the quantizer input swings from the Phase 1 voltage. Although the output of operational amplifier 306 must drive a large voltage swing, the quantizer input capacitance does not need to be charged across that large voltage swing. This still results in a substantial power savings over the conventional circuit of FIG. 3A.

Although the present invention and its advantages have been described in detail, it should be understood that various changes, substitutions and alterations can be made herein without departing from the spirit and scope of the invention as defined by the appended claims.

What is claimed is:

1. A switched-capacitor summer comprising:
   an operational amplifier having an input and an output;
   first and second parallel capacitors;
   first switching circuitry for discharging said first capacitor during a first timing phase and coupling said first capacitor between said input and said output of said operational amplifier during a second timing phase; and
   second switching circuitry for coupling said second capacitor between said input and said output of said operational amplifier during said first phase to maintain a voltage at said output and for charging said second capacitor during said second phase from a voltage output from the output of the operational amplifier.

2. The switched capacitor summer of claim 1 wherein said first switching circuitry comprises:
   a first switch for coupling first and second plates of said first capacitor during said first phase; and
   a second switch for coupling said first plate of said first capacitor with said output during said second phase.

3. The switched capacitor summer of claim 1 wherein said second switching circuitry comprises:
   a first switch for coupling a first plate of said second capacitor with said input during said first phase; and
   a second switch for coupling said first plate of said second capacitor with a common mode voltage during said second phase.

4. The switched capacitor summer of claim 1 wherein said input of said operational amplifier comprises an inverting input and said output comprises a non-inverting output.

5. The switched capacitor summer of claim 1 wherein said input of said operational amplifier comprises a non-inverting input and said output comprises an inverting output.

6. The switched capacitor summer of claim 1 further comprising:
   a sampling capacitor;
   a plurality of switches for selectively coupling a plurality of signals to be summed to said sampling capacitor during said second phase; and
   a switch for selectively coupling said sampling capacitor to said input of said operational amplifier during said second phase.

7. A delta-sigma modulator comprising:
   an input summer;
   a lowpass filter comprising a plurality of stages;
   an analog summer for summing outputs from selected ones of the stages of the lowpass filter and having a summing capacitor and circuitry for discharging the summing capacitor during a first time period and coupling the summing capacitor between an input and an output of the summer during a second time period;
   a capacitance for maintaining a voltage at the output of the analog summer during the first time period, the capacitance charged from an output voltage of the analog summer during the second time period;
   a quantizer for generating a digital signal from an output of the analog summer; and
   a feedback loop including a digital to analog converter for feeding back an output of the quantizer to the input summer.

8. The delta-sigma modulator of claim 7 wherein the capacitance is provided by an input capacitance of the quantizer.

9. The delta-sigma modulator of claim 7 wherein the capacitance is provided by a hold-up capacitor disposed in parallel with the summing capacitor, and the summer further comprises second switching circuitry for coupling the hold-up capacitor between the input and the output of the summer during the first phase to maintain a voltage at the output of the summer and for charging the hold-up capacitor during the second phase.

10. The delta-sigma modulator of claim 7 wherein the quantizer comprises a single-bit quantizer.

11. The delta-sigma modulator of claim 7 wherein the quantizer comprises a multi-bit quantizer.

12. The delta-sigma modulator of claim 7 wherein said stages of said lowpass filter comprise integrator stages.

13. An audio subsystem comprising:
    a delta sigma modulator comprising:
       a plurality of cascaded integrator stages; and
       a summer for summing output signals from selected ones of said integrator stages comprising:
          a sampling capacitor for storing charge sampled from said output signals of said selected integrator stages;
          an operational amplifier having an input selectively coupled to said sampling capacitor and an output;
          an integrator capacitor;
          a hold up capacitor;
          first switching circuitry for discharging said integrator capacitor during a first timing phase and coupling said integrator capacitor between said input and said output of said operational amplifier during a second timing phase; and
          second switching circuitry for coupling said hold-up capacitor between said input and said output of said operational amplifier during said first phase to maintain a voltage at said output and for charging said integrator capacitor during said second phase from a voltage at said output of said operational amplifier.

14. The audio subsystem of claim 13 wherein said delta-sigma modulator forms a portion of an analog to digital converter.

15. The audio subsystem of claim 13 wherein said delta-sigma modulator forms a portion of a digital to analog converter.

16. The audio subsystem of claim 13 wherein said delta-sigma modulator further comprises a multi-bit quantizer coupled to an output of said summer.

17. A method of summing a plurality of signals in a switched-capacitor summer including an operational amplifier having an input and an output and a summing capacitor comprising the steps of:
    discharging the summing capacitor during a first timing phase;
    coupling a second charged capacitor to the output of the operational amplifier during the first timing phase to maintain a voltage at the operational amplifier output;
    coupling the summing capacitor between the input and the output of the operational amplifier during a second timing phase; and charging the second capacitor with a voltage output from the operational amplifier during the second phase.

18. The method of summing of claim 17 wherein said step of coupling a second capacitor comprises the step of coupling an input capacitance of a quantizer to the output of the operational amplifier.

19. The method of summing of claim 17 wherein said step of coupling a second capacitor comprises the step of coupling a discrete hold-up capacitor to the output of the operational amplifier.

20. The method of summing of claim 17 and further comprising the step of providing the plurality of signals by sampling selected outputs of a plurality of cascaded integrator stages.

\* \* \* \* \*

UNITED STATES PATENT AND TRADEMARK OFFICE
CERTIFICATE OF CORRECTION

PATENT NO. : 6,570,519 B1
DATED : May 27, 2003
INVENTOR(S) : Yang

It is certified that error appears in the above-identified patent and that said Letters Patent is hereby corrected as shown below:

Title page,
Item [75], Inventor, delete "Yu Qing" and insert -- YuQing --;
Item [73], Assignee, delete "Cirus" and insert -- Cirrus --;

Column 1,
Line 9, after "2001 by inventor" delete "Yu Qing" and insert -- YuQing --; and
Line 16, after "2001 by inventor" delete "Yu Qing" and insert -- YuQing --.

Signed and Sealed this

Eighteenth Day of November, 2003

JAMES E. ROGAN
*Director of the United States Patent and Trademark Office*